United States Patent
Slik et al.

(10) Patent No.: US 9,830,221 B2
(45) Date of Patent: Nov. 28, 2017

(54) RESTORATION OF ERASURE-CODED DATA VIA DATA SHUTTLE IN DISTRIBUTED STORAGE SYSTEM

(71) Applicant: NetApp, Inc., Sunnyvale, CA (US)

(72) Inventors: David Slik, Burnaby (CA); Ronnie Lon Hei Chan, Sunnyvale, CA (US); Vishnu Vardhan Chandra Kumaran, Sunnyvale, CA (US)

(73) Assignee: NETAPP, INC., Sunnyvale, CA (US)

( * ) Notice: Subject to any disclaimer, the term of this patent is extended or adjusted under 35 U.S.C. 154(b) by 98 days.

(21) Appl. No.: 15/090,924

(22) Filed: Apr. 5, 2016

(65) Prior Publication Data
US 2017/0288701 A1    Oct. 5, 2017

(51) Int. Cl.
G06F 11/10        (2006.01)
H03M 13/15        (2006.01)

(52) U.S. Cl.
CPC ....... *G06F 11/1076* (2013.01); *H03M 13/154* (2013.01)

(58) Field of Classification Search
CPC .......... H03M 13/154; G06F 11/1076–11/1096
See application file for complete search history.

(56) References Cited

U.S. PATENT DOCUMENTS

| | | | | |
|---|---|---|---|---|
| 9,218,244 B1* | 12/2015 | Hayes | ................. | G06F 11/1076 |
| 2014/0380088 A1* | 12/2014 | Bennett | ............... | G06F 11/2058 |
| | | | | 714/6.2 |
| 2015/0160864 A1* | 6/2015 | Usgaonkar | .............. | G06F 3/065 |
| | | | | 711/162 |
| 2016/0011936 A1* | 1/2016 | Luby | ..................... | G06F 3/0617 |
| | | | | 714/6.2 |
| 2016/0062832 A1* | 3/2016 | Slik | ..................... | G06F 11/1076 |
| | | | | 714/766 |

* cited by examiner

*Primary Examiner* — Joseph Kudirka
(74) *Attorney, Agent, or Firm* — Gilliam IP PLLC

(57) ABSTRACT

Embodiments use data shuttle devices to restore erasure-coded data in a distributed storage environment. In some embodiments, a first data shuttle is communicatively coupled to a first node of the storage environment. On the data shuttle, first restoration data is generated from a first erasure-coded data portion stored on the first node. The first data shuttle or a second data shuttle is communicatively coupled to a second node of the storage environment. On the data shuttle at the second node, second restoration data is generated from a second erasure-coded data portion stored on the second node. Subsequent to transporting the first or second data shuttle from at least one of the other nodes to a third node, a third erasure-coded data portion is restored at the third node. The third erasure-coded data portion is generated via an erasure-coding process from one or more of the first or second restoration data.

20 Claims, 10 Drawing Sheets

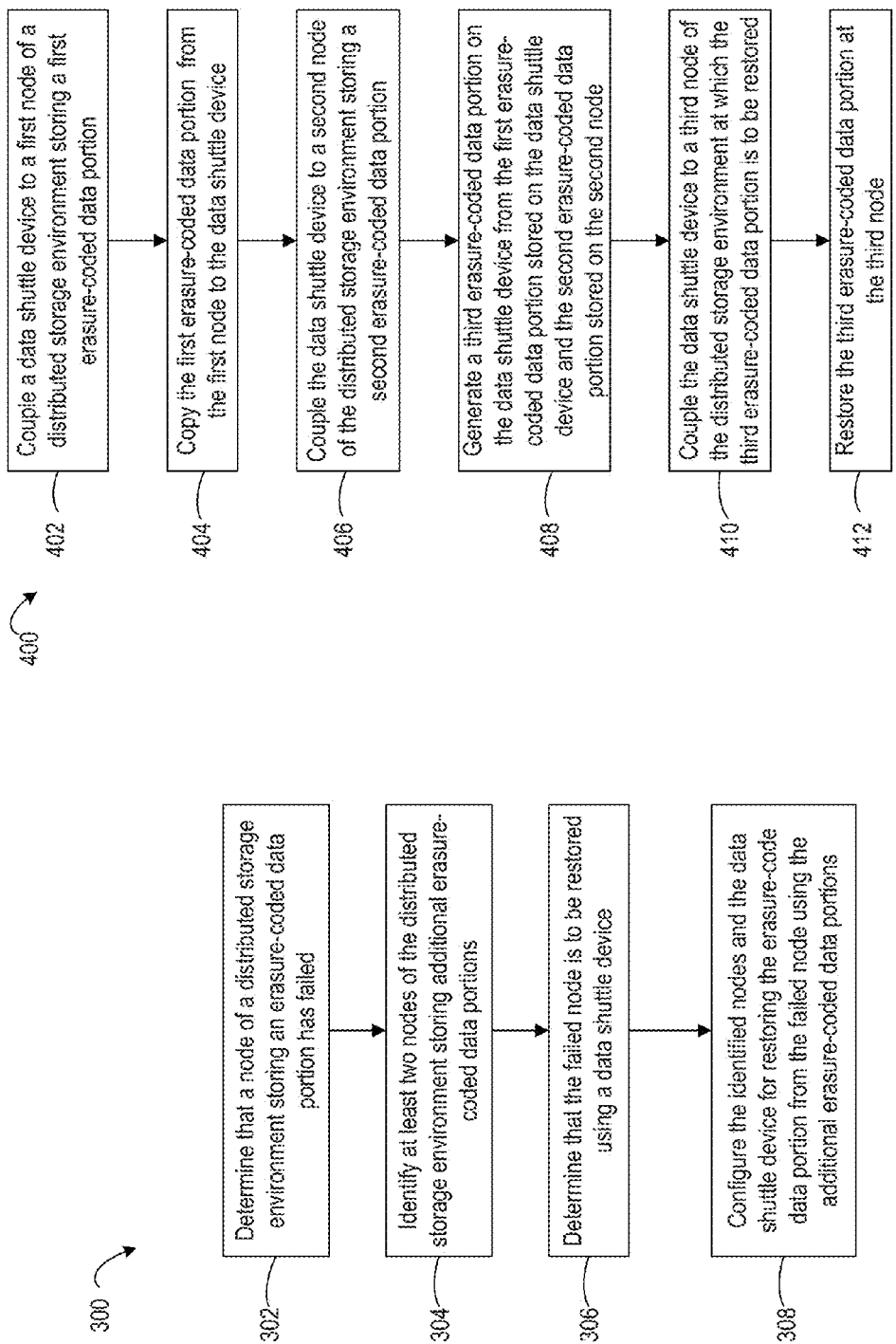

RESTORATION OF ERASURE-CODED DATA VIA DATA SHUTTLE IN DISTRIBUTED STORAGE SYSTEM

TECHNICAL FIELD

The present disclosure relates generally to storage systems and more specifically to using data shuttle devices for restoring erasure-coded data in a distributed storage environment.

BACKGROUND

In a large-scale distributed storage system, individual computing nodes will commonly fail or become unavailable from time to time. Therefore, storage systems typically implement some type of recovery scheme for recovering data that has been lost, degraded, or otherwise compromised due to node failure or other causes. One such scheme is known as erasure coding. Erasure coding generally involves the creation of codes used to introduce data redundancies (also called "parity data") that is stored along with original data (also referred to as "systematic data") to thereby encode the data in a prescribed manner. If any systematic data or parity data becomes compromised, such data can be recovered through a series of mathematical calculations.

At a basic level, erasure coding for a storage system involves splitting a data file of size M into X chunks, each of the same size M/X. An erasure code is then applied to each of the X chunks to form A encoded data chunks, which again each have the size M/X. The effective size of the data is A×M/X, which means the original data file M has been expanded A/X times, with the condition that A≥X. As a consequence of various encodings, any Z chunks of the available A encoded data chunks (where A≥Z≥X) can be used to recreate the original data file M. Erasure codes where Z=X are referred to as maximum distance separable ("MDS"), and are considered optimal as they have the greatest error correcting and detecting capabilities.

A simple example of a (4, 2) erasure code applied to a data file M is shown in FIG. 1. As shown, a data file M is split into two chunks $X_1$, $X_2$ of equal size, and an encoding scheme is applied to those chunks to produce four encoded chunks $A_1$, $A_2$, $A_3$, $A_4$. By way of example, the encoding scheme may be one that results in the following relationships: $A_1=X_1, A_2=X_2, A_3=X_1+X_2,$ and $A_4=X_1+2\times X_2$. In this manner, the four encoded data chunks can be stored across a storage network, such that the one encoded data chunk is stored in each of four computing nodes. Then, the encoded data chunks stored in any two of the four computing nodes can be used to recover the entire original data file M. This means that the original data file M can be recovered if any two of the computing nodes fail.

Erasure-coded data stored in a distributed data storage environment (e.g., a NetApp® StorageGRID® system) can span multiple computing nodes. Operations for restoring erasure-coded data may involve large data transfers among computing nodes. For example, successfully repairing erasure-coded data stored on some or all of a computing node or volume may involve transferring one or more large data sets from one or more volumes on source nodes to one or more volumes on destination nodes.

Thus, if erasure-coded data is stored across multiple sites, a significant data loss may require transferring substantial amounts of data over a wide-area network ("WAN"). For example, erasure-coded data may be stored across three sites. Content at one of the sites may be lost due to a failure of a computing node at that site. Restoring the lost content may require transferring erasure-coded data from the two remaining sites to the third site via a WAN. In this erasure-coding scheme, the amount of data transferred over the WAN is twice the amount of lost data to be restored. To generalize, for simple one-to-one mappings of erasure-coded chunks to nodes, the amount of data required to rebuild a given node is X times the size of the data lost on that node. Thus, as the size of X increases, the cost of a rebuild also increases. This transfer process may present significant expenses in terms of network bandwidth, processing resources, storage resources, or some combination thereof.

Therefore, alternatives to using a WAN for transferring data during a restoration process are desirable.

SUMMARY

Systems, devices, and methods are described for using data shuttle devices to restore erasure-coded data in a distributed storage environment. For example, a first data shuttle device can be communicatively coupled to a first node of the distributed storage environment. On the first data shuttle device, first restoration data can be generated from a first erasure-coded data portion stored on the first node. The first data shuttle device or a second data shuttle device can be communicatively coupled to a second node of the distributed storage environment. On the data shuttle device coupled to the second node, second restoration data can be generated from a second erasure-coded data portion stored on the second node. Subsequent to physically transporting at least one of the first or second data shuttle devices from at least one of the first or second nodes to a location of a third node of the distributed storage environment, a third erasure-coded data portion can be restored at the third node. The third erasure-coded data portion is generated via an erasure-coding process from one or more of the first or second restoration data.

These illustrative examples are mentioned not to limit or define the disclosure, but to provide examples to aid understanding thereof. Additional embodiments and examples are discussed in the Detailed Description, and further description is provided there.

BRIEF DESCRIPTION OF THE FIGURES

These and other features, embodiments, and advantages of the present disclosure are better understood when the following Detailed Description is read with reference to the accompanying drawings.

FIG. 3 is a flow chart depicting an example of a method for configuring a distributed storage environment to use a data shuttle device to restore erasure-coded data according to some embodiments.

FIG. 4 is a flow chart depicting an example of a method for using a data shuttle device to restore erasure-coded data in a distributed storage environment according to some embodiments.

DETAILED DESCRIPTION

Figure 1:
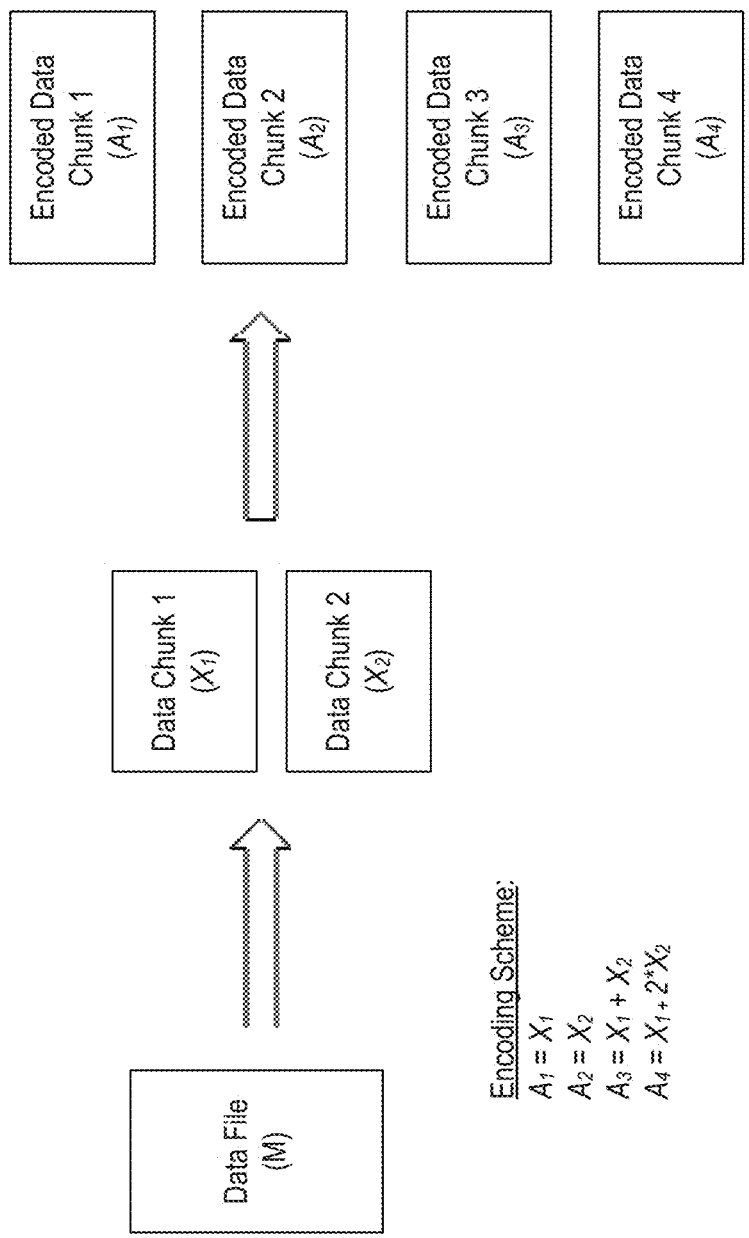
FIG. 1 is a block diagram illustrating a simple example of a (4, 2) erasure code applied to a data file M.

Systems and methods are described for using data shuttle devices to restore erasure-coded data in a distributed storage environment. For example, one or more data shuttle devices that store portions of erasure-coded data can be physically transported to different sites in a distributed storage environment. The erasure-coded data portions stored on one or more data shuttle devices can be used to restore lost erasure-coded data at a given site in the distributed storage environment. In some embodiments, using data shuttle devices to restore erasure-coded data in the distributed storage environment can reduce the amount of data that must be transferred over a wide-area network ("WAN") that communicatively couples different computing nodes of the distributed storage environment. Reducing the amount of data that must be transferred over the WAN can efficiently use resources in the distributed storage environment (e.g., network bandwidth, processing resources, etc.) and thereby reduce the costs for restoring lost data via erasure-coding techniques.

The following example is provided to help introduce the general subject matter of certain embodiments. In an erasure-coding scheme, a data set is divided into fragments that can be combined to reconstruct or otherwise restore the original data set. For example, in a two-of-three erasure-coding scheme, any two of any three data fragments can be used to reconstruct the data set. Thus, if a distributed storage environment includes three computing nodes, with each of the computing nodes storing a respective erasure-coded fragment, any one of the computing nodes can fail without losing the entire data set. Although the total size of the erasure-coded fragments may be larger than a replica of the data set, storing three fragments across three computing nodes can require less space than storing three full replicas across the three computing nodes. But rebuilding a lost computing node or otherwise restoring a lost erasure-coded data fragment may require transferring the two other data fragments to the computing node at which the lost fragment is to be restored. This restoration process may require a significant amount of data transfer over, for example, a bandwidth-limited WAN.

This WAN data transfer can be replaced or supplemented with physical transportation of one or more data shuttle devices among computing nodes in the distributed storage environment. In a simplified example involving a three-node storage environment, a node can experience a significant data loss of erasure-coded data. A management application in the distributed storage environment can determine that using a data shuttle device for transferring restoration data from the other two nodes may be advantageous as compared to restoring the lost data via a WAN. Restoration data can include one or more erasure-coded data portions from one or more computing nodes that can be used to restore another erasure-coded data portion at another computing node. In some embodiments, the restoration data includes erasure-coded data portions from which a lost data portion can be regenerated using erasure-coding techniques. In additional or alternative embodiments, the restoration data includes a regenerated data portion that is generated using erasure-coding techniques at one computing node and then transported to another computing node that has experience a data loss.

In some embodiments, a data shuttle device can be physically transported to one of the two surviving nodes. An erasure-coded data portion corresponding to the lost data is copied to the data shuttle device. The data shuttle device is then physically transported to another one of the two surviving nodes. The lost erasure-coded data portion is generated from a first erasure-coded data portion stored on the data shuttle device and a second erasure-coded portion stored on the other surviving node. The generated erasure-coded data portion is stored on the data shuttle device and physically transported to the site at which the data loss occurred. The generated erasure-coded data portion is restored at the site.

In additional or alternative embodiments, data shuttle devices can be physically transported to respective surviving nodes in parallel. A separate erasure-coded data portion can be copied to each data shuttle device. The data shuttle devices can be physically transported in parallel to the to the site at which the data loss occurred. At the site at which lost data is to be restored, the lost erasure-coded data portion is generated from a first erasure-coded data portion stored on a first data shuttle device and a second erasure-coded portion stored on a second data shuttle device. The generated erasure-coded data portion is restored at the site.

In additional or alternative embodiments, the examples described above can be used in combination. For example, a node in a distributed storage environment (e.g., a node C) may experience a loss of multiple erasure-coded data portions. A first set of data shuttle devices can be used to regenerate some of the lost erasure-coded data portions and a second set of data shuttle devices can be used to regenerate the other lost erasure-coded data portions. To do so, the first and second sets of data shuttle devices can be coupled to first and second surviving nodes (e.g., a node A and a node B), respectively. Certain erasure-coded data can be copied to the first set of data shuttle devices from node A, and other erasure-coded data can be copied to the second set of data shuttle devices from node B. The first set of data shuttle devices can then be transported from node A to node B, and the second set of data shuttle devices can then be transported from node B to node A. At node A, some of the lost erasure-coded data portions can be regenerated from additional erasure-coded data stored at node A and erasure coded data from node B that was copied to the second set of data shuttle devices. Furthermore, at node B, other lost erasure-coded data portions can be regenerated from additional erasure-coded data stored at node B and erasure coded data from node A that was copied to the first set of data shuttle devices. The first and second sets of data shuttle devices can then be physically transported to the location of node C, and the regenerated erasure-coded data portions can be restored to node C.

These three-node examples are provided for illustrative purposes only. A distributed storage environment can use any number of data shuttle devices to restore erasure-coded data from any number of nodes. For example, in a multi-node storage environment, the processes described above can be performed one or more times for multiple subsets of nodes until a data shuttle device includes an erasure-coded data portion to be restored at a node that experienced a data loss.

Figure 2:
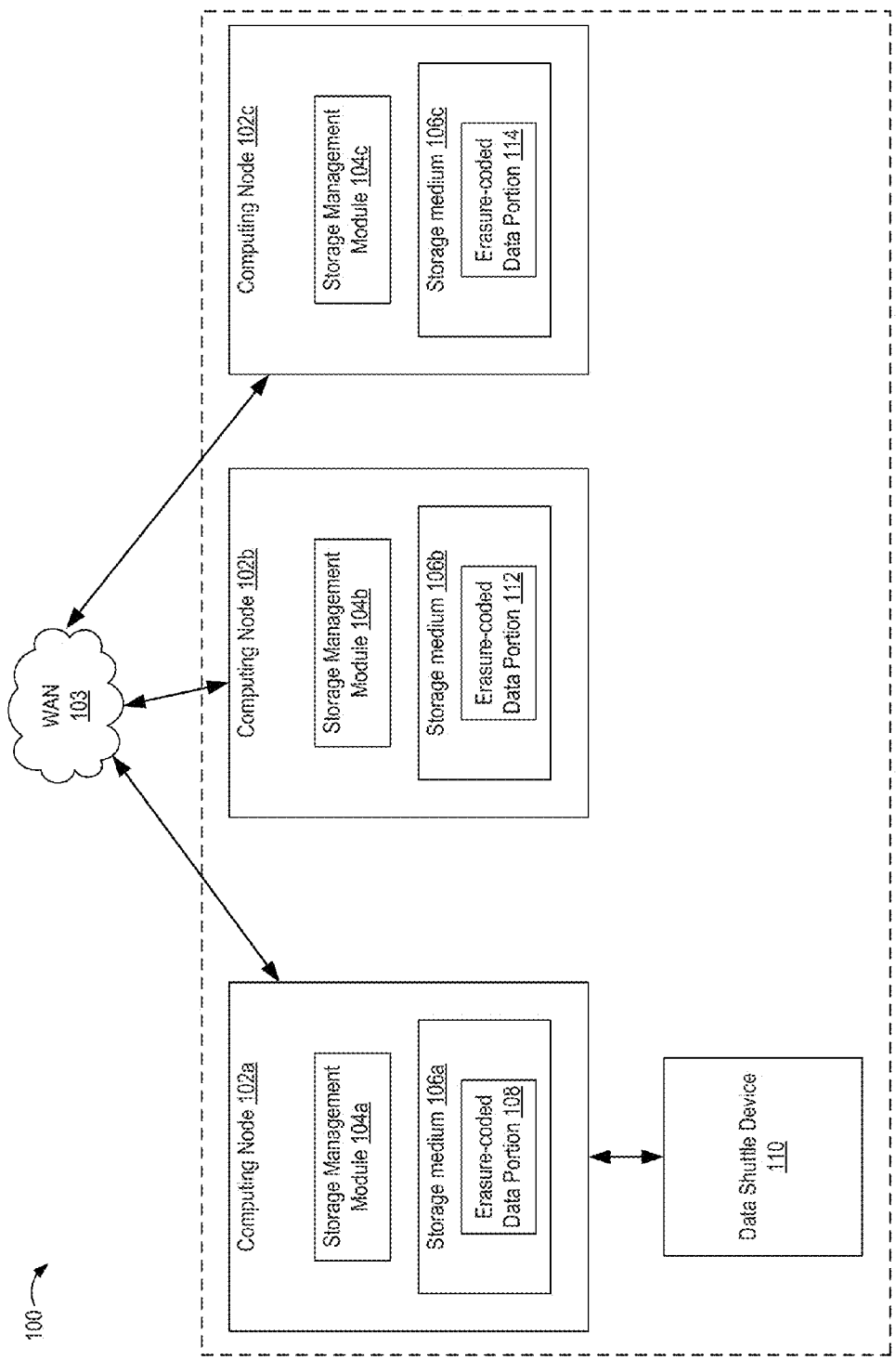
FIG. 2 is a block diagram depicting an example of a distributed storage environment in which one or more data shuttle devices can be used for restoring erasure-coded data according to some embodiments.

Referring now to the drawings, FIG. 2 is a block diagram depicting an example of a distributed storage environment 100 in which one or more data shuttle devices can be used for restoring erasure-coded data to one or more computing nodes. The distributed storage environment 100 can include multiple computing nodes 102a-c communicatively coupled to a WAN 103. The computing nodes 102a-c can be positioned in geographically separated sites. The computing nodes 102a-c can include one or more interface devices for communicating with data networks, other processing nodes, or other devices.

In some embodiments, the distributed storage environment 100 is a storage grid of fixed-content objects. In response to a request for information, the distributed storage environment 100 may serve that request based on the location of the data, the location of the user, the load on the system, the state of the network and other factors. This balances the load on the network, storage, and computing nodes in order to minimize bandwidth usage and increase performance. The distributed storage environment 100 can be a unified environment with multiple servers or repositories of content or metadata.

For illustrative purposes, FIG. 2 depicts a distributed storage environment 100 that includes three computing nodes 102a-c. However, any number of computing nodes can be included in a distributed storage environment 100.

In the example depicted in FIG. 2, the computing nodes 102a-c respectively execute storage management modules 104a-c. Each of the storage management modules 104a-c includes suitable computing instructions that are executable by one or more processing devices for coordinating data transfers in the distributed storage environment 100, restoring failed volumes in the distributed storage environment 100, or otherwise managing resources in the distributed storage environment 100. In some embodiments, instances of a storage management application (e.g., the storage management modules 104a-c) can be executed at different nodes or sites to manage the storage environment 100. In additional or alternative embodiments, a storage management application can be executed on a computing device other than one of the computing nodes of the distributed storage environment 100. This storage management application can communicate with one or more storage management modules 104a-c executing on one or more computing nodes 102a-c.

A storage management application that includes or communicates with the storage management modules 104a-c may implement various software services, such as a content metadata service and an administrative domain controller service. Although these services can run on separate computing resources, they may also share a single server or other computing node. The content metadata service can include a distributed business rules engine that provides for content metadata storage, metadata synchronization, metadata query, and enforcement of erasure coding and information lifecycle management business logic. Erasure coding and information lifecycle management policies may be based on metadata that is associated with stored objects. This allows the creation of rules that determine where content and metadata is stored, how many copies are stored, and on what media it is stored on throughout its lifecycle. A content metadata service may interface, for example, with a local SQL database through a database abstraction layer.

The administrative domain controller can act as a trusted authentication repository for node-to-node communication. The administrative domain controller can provide knowledge of system topology and information to optimize real-time usage of network bandwidth, processing resources, and storage resources. Optimizing the use of one or more of these resources allows automated management of computational resources and dynamic load balancing of requests based on the available network bandwidth, processing resources, and storage resources.

The computing nodes 102a-c can also include respective storage media 106a-c. Each of the storage media 106a-c includes one or more data storage devices. For example, the storage media 106a-c may each include one or more hard disk drives, flash drives, solid state drives, flash memory, other types of storage devices, or a combination thereof.

The storage media 106a-c can be used to store respective portions of an erasure-code data set. For example, as depicted in FIG. 2, the computing node 102a stores an erasure-coded data portion 108 in the storage medium 106a, the computing node 102b stores an erasure-coded data portion 112 in the storage medium 106b, and the computing node 102c stores an erasure-coded data portion 114 in the storage medium 106c. Any two of the erasure-coded data portions 108, 112, 114 can be used to restore a third one of the erasure-coded data portions 108, 112, 114 or the entire data set corresponding to the erasure-coded data portions 108, 112, 114.

The WAN 103 can include one or more devices for exchanging information among different computing nodes 102a-c that are positioned in geographically disparate areas. In various embodiments, the WAN 103 can include one or more of a metropolitan area network, a telecommunications network, the Internet, or any combination thereof. The WAN 103 can include routers, hubs, computers, servers, or other types of computing devices. The WAN 103 may also include one or more of wired communication links, wireless communication links, or a combination thereof.

Computing nodes in the distributed storage environment 100 can be removed from the distributed storage environment 100 for a variety of reasons. For example, a computing node can be decommissioned, replaced, temporarily disconnected, or experience a failure. If a computing node fails or is otherwise removed from the distributed storage environment 100, data from one or more computing nodes may be moved as part of the failure recovery process.

Data can be migrated within the distributed storage environment 100 in various ways, such as physically or electronically, manually or automatically. Exemplary data migration tools include host-based, array-based, application-based, and appliance-based systems. In a host-based system, an operating system provide basic tools to copy data from one location to another. In an array-based system, the application servers are bypassed and a storage array controller migrates the data. In an application based system, the applications have copy functions for migration. In an appliance-based system, an appliance is placed between a host and a storage array. The appliance then migrates data to another location. In a grid-based system, the distributed storage environment 100 itself migrates data such that the locations of the data is not visible to the applications. This is known as location independence.

The amount of data communicated in a given data migration exercise may range from a few terabytes (TB) to hundreds of terabytes or even petabytes (PB) of data. One TB is defined as 1,000,000,000,000 or $10^{12}$ bytes, that is, one thousand gigabytes. One petabyte is defined as 1,000,000,000,000,000 or $10^{15}$ bytes, that is, one thousand terabytes.

Migrating large amounts of data over a WAN 103, such as the Internet, may not be desirable. For example, these data migrations may involve one high costs of setting up or leasing communication lines, limited data transfer rates, and complicated infrastructure needed to deploy for possibly a single use (e.g., restoration of a failed node).

These large WAN data transfers can be reduced using a data shuttle device. For example, one or more data shuttle devices 110 can be used to move erasure-coded data portions from one location (e.g., a site at which a first computing node is deployed) to another location (e.g., a site at which one or more other computing nodes are deployed). The data shuttle device 110 may be physically located at the same site as a computing node (e.g., computing node 102a) from which data is to be copied to the data shuttle device 110 or otherwise generated on the data shuttle device 110. This example can be applied to a grid environment, which would involve one or more data shuttle devices 110 being communicatively coupled to one or more storage nodes (i.e., any set of storage nodes) at a given site. The data shuttle device(s) 110 coupled to one or more storage nodes can be used to receive fragments from some or all storage nodes at that given site via a LAN and store the fragments.

A storage management application that includes or communicates with the storage management modules 104a-c can uniquely identify data shuttle device 110 from other storage locations on the distributed storage environment 100. The storage management application can configure a computing node, which is communicatively coupled to the data shuttle device 110, to copy data objects to or generate data objects on the data shuttle device 110 for restoring lost data objects at another computing node.

FIG. 2 depicts a data shuttle device 110 that is communicatively coupled to a computing node 102a. The data shuttle device 110 can include any suitable device. In some embodiments, data shuttle device 110 can be a server or other computing device that may be used to replace a lost computing node.

The data shuttle device 110 can be communicatively coupled to a computing node in any suitable manner. In some embodiments, the data shuttle device 110 is communicatively coupled to a computing node via a physical interface such as a USB interface. In additional or alternative embodiments, the data shuttle device 110 is communicatively coupled to a computing node via a network interface such as an Ethernet interface. For example, the data shuttle device 110 can be communicatively coupled to a computing node via a local area network service the site at which the computing node is located. In additional or alternative embodiments, the data shuttle device 110 is communicatively coupled to a computing node via an interface such as a Wi-Fi interface or other wireless interface that allows direct communication between the computing node and the data shuttle device 110.

A location of the data shuttle device 110 can be registered with one or more of the storage management modules 104a or with a storage management application that includes or communicates with the storage management modules 104a-c. The storage management application can receive a device identifier for the data shuttle device 110 when the data shuttle device 110 is communicatively coupled to one or more computing nodes. The storage management application can determine, using the device identifier, that the data shuttle device 110 can be used for restoring lost data in the distributed storage environment 100. If the data shuttle device 110 is transported to another computing node, the data shuttle device 110 can be registered with the storage management application as being in local communication with that computing node.

A storage management application that includes or communicates with the storage management modules 104a-c can initiate, coordinate, or otherwise manage data-restoration operations involving the data shuttle device 110. For example, FIG. 3 is a flow chart depicting a method 300 for configuring the distributed storage environment 100 to use a data shuttle device 110 to restore erasure-coded data according to some embodiments. For illustrative purposes, the method 300 is described with reference to the devices depicted in FIG. 2. Other implementations, however, are possible.

The method 300 involves determining that a node of a distributed storage environment storing an erasure-coded data portion has failed, as shown in block 302. For example, a storage management application that includes or communicates with the storage management modules 104a-c can be executed by one or more processing devices to determine that one of the computing nodes 102a-c has failed. The storage management application can determine the failure in any suitable manner. In some embodiments, the storage management application can receive a message from a computing node that a volume on the computing node's storage medium has failed and that an erasure-coded data portion has been lost. In other embodiments, the storage management application can receive a message from a user via a suitable interface indicating that a computing node has failed or that an erasure-coded data portion has otherwise been lost.

The method 300 also involves identifying at least two nodes of the distributed storage environment storing additional erasure-coded data portions, as shown in block 304. For example, a storage management application can be executed by one or more processing devices to determine that a computing nodes 102c storing erasure-coded data portion 114 has failed, and that the computing nodes 102a, 102b are storing erasure-coded data portions 108, 112 from which the erasure-coded data portion 114 can be recovered.

In some embodiments, fewer than all of the erasure-coded data portions may be required for recovering an original data file or other data object. For example, in some erasure-coding schemes, four erasure-coded data portions (e.g., encoded data chunks) can be stored across the distributed storage environment 100, such that one erasure-coded data portion is stored in each of four computing nodes. Two of the four erasure-coded data portions can be used to recover another one of the erasure-coded data portions (or the original data file or other data object).

In this example or similar examples, the storage management application can identify an optimal subset of the computing nodes that will be used to restore data at a failed computing node. For example, if two of four erasure-coded data portions are sufficient for a recovery operation, the storage management application can identify two computing nodes with erasure-coded data portions having optimal geographic locations (e.g., geographical locations that reduce or minimize the total travel distance for one or more data shuttle devices 110). The computing nodes with optimal geographic locations can be selected for the recovery operation. In additional or alternative embodiments, computing nodes can be selected based on criteria such as (but not limited to) one or more of loads on computing nodes (e.g., how busy the nodes are), wear (e.g., cost of reading the data), performance (e.g., throughput for data transfer, as different nodes or locations may have resources available such as processing power, bandwidth capability, storage capability, etc.), latency (e.g., time to fetch an object from a storage medium), accessibility (e.g., if a node is in a location that is difficult or expensive to reach, such as a restricted locations).

The method 300 also involves determining that the failed node is to be restored using a data shuttle device, as shown in block 306. For example, a storage management application can be executed by one or more processing devices to determine that the amount of data included in one or more of the erasure-coded data portions 108, 112 is sufficiently large that transmitting one or more of the erasure-coded data portions 108, 112 over the WAN 103 is undesirable.

The storage management application can use any suitable criteria for determining the undesirability of transmitting one or more of the erasure-coded data portions 108, 112 over the WAN 103. In some embodiments, the storage management application determines that an amount of network traffic generated by transmitting one or more of the erasure-coded data portions 108, 112 over the WAN 103 would exceed a threshold amount of network traffic. In additional or alternative embodiments, the storage management application determines that the processing resource required for transmitting one or more of the erasure-coded data portions 108, 112 over the WAN 103 would exceed a threshold amount of available processing resources, would negatively impact other operations performed by the distributed storage environment 100, or would otherwise be unacceptable. In additional or alternative embodiments, the storage management application determines that a data shuttle should be used for restoring lost data based on one or more criteria such as (but not limited to) time required for restoration (e.g., time required to transfer the data over the WAN 103), cost (e.g., additional expenses or capacity requirements associated with additional data traffic over the WAN 103), security (e.g., decreasing the visibility of a failure by avoiding noticeable changes in network traffic over the WAN 103).

The method 300 also involves configuring the identified nodes and the data shuttle device for restoring the erasure-code data portion from the failed node using the additional erasure-coded data portions, as shown in block 308. For example, the storage management application can be executed by one or more processing devices to generate a plan for restoring erasure-coded data previously stored on a failed node.

Generating the plan can include selecting, assigning, or otherwise identifying a data shuttle device 110 that is to be used in restoring the lost erasure-code data portion. For example, a storage management module 104a may determine that a data shuttle device 110 is communicatively coupled to or is otherwise co-located with a computing node 102a that stores an erasure-coded data portion 108. The storage management module 104a may identify a device identifier that is unique to the data shuttle device 110. The storage management module 104a or other components of a storage management application can assign the device identifier for the data shuttle device 110 to a restoration plan for the failed node.

Generating the plan can also include instructing one or more computing nodes in the distributed storage environment 100 that the data shuttle device 110 is to be used for restoring a lost erasure-coded data portion. For example, if one of the computing nodes 102a-c experiences a failure, a storage management application can transmit instructions via the WAN 103 to other computing nodes that store erasure-coded data portions usable for restoring a lost erasure-coded data portion (e.g., the computing nodes identified in block 304). The instructions can include the device identifier for the data shuttle device 110. The instructions can cause the computing nodes to respond to a detection of the data shuttle device 110 by copying certain erasure-coded data portions to the data shuttle device 110 or otherwise generating certain erasure-coded data portions for storage on the data shuttle device 110.

For example, if a computing node is instructed to look for the data shuttle device 110, the computing node can compare a device identifier of a device in communication with the computing node to a device identifier specified in the instructions. If the comparison results in a match (e.g., for the specified data shuttle device 110), the computing node can perform one or more operations involving the data shuttle device 110 for restoring a lost erasure-coded data portion.

Any suitable method can involve using the data shuttle device 110 to restore a lost erasure-coded data portion. For example, FIG. 4 is a flow chart depicting an example of a method 400 for using a data shuttle device to restore erasure-coded data in a distributed storage environment according to some embodiments. For illustrative purposes, the method 300 is described with reference to the devices depicted in FIG. 2. Other implementations, however, are possible.

Figure 5:
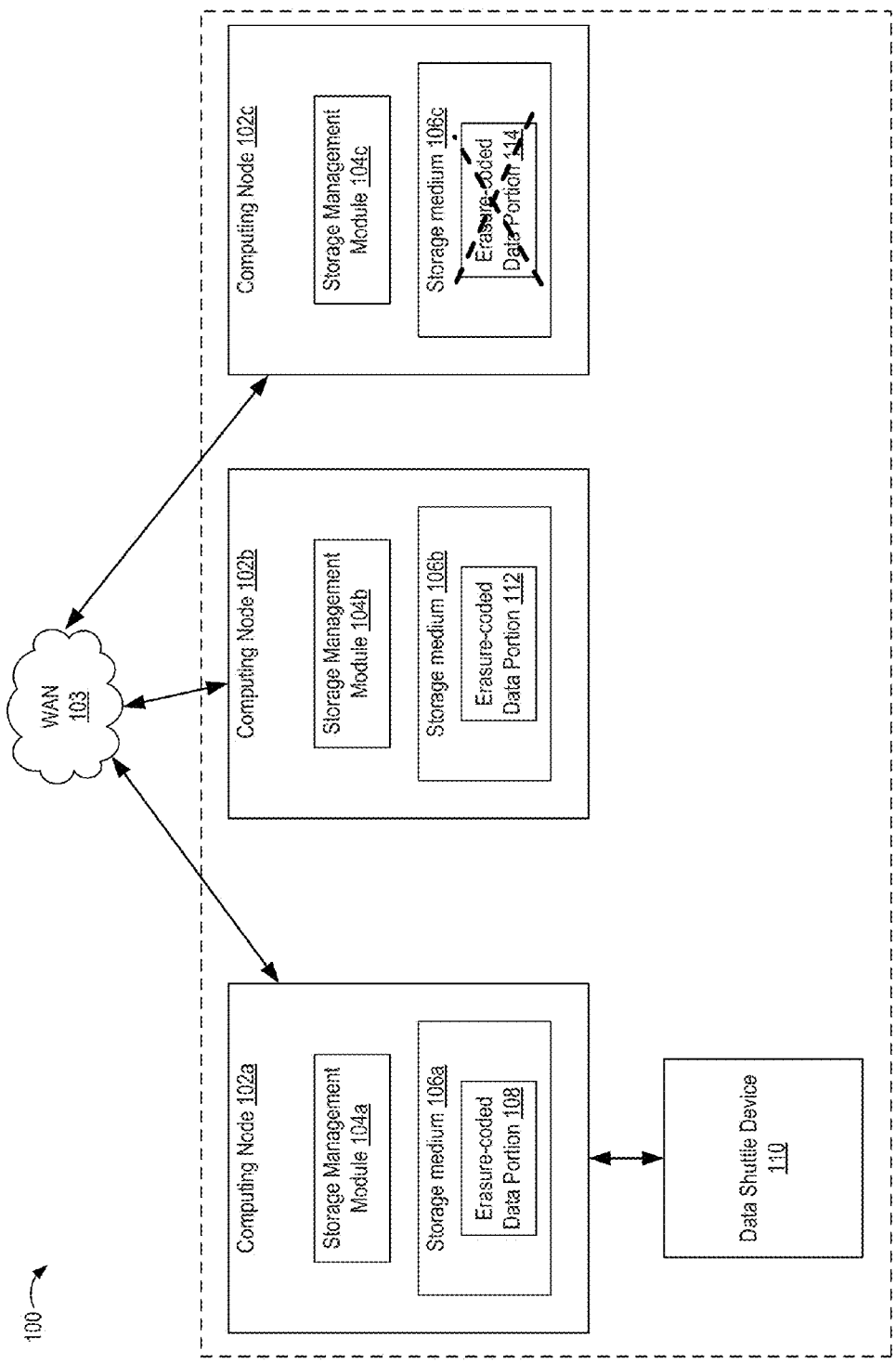
FIG. 5 is a block diagram depicting an example of the distributed storage environment of FIG. 1 in which a computing node has failed according to some embodiments.
Figure 6:
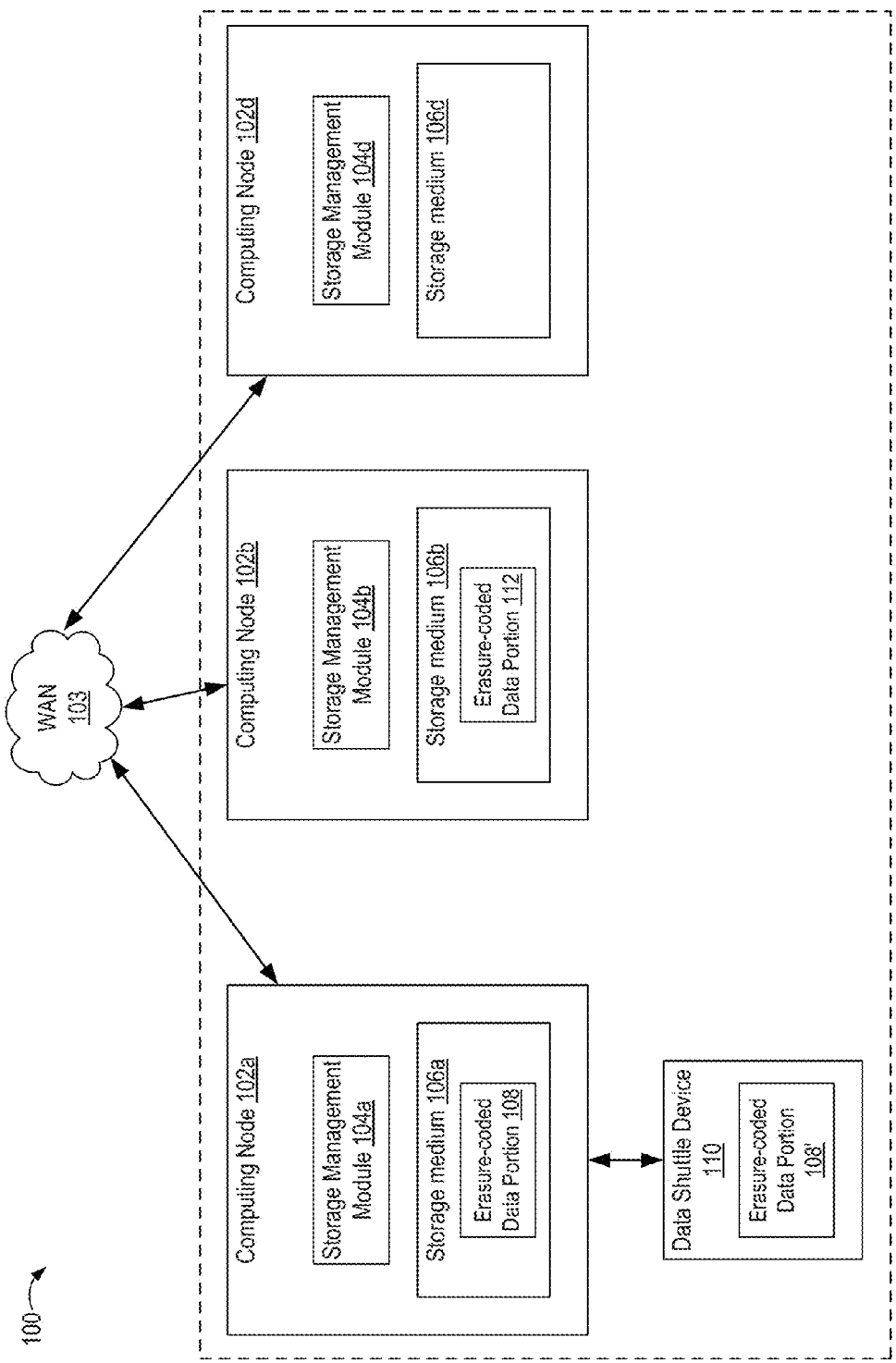
FIG. 6 is a block diagram depicting an example of the distributed storage environment of FIGS. 1 and 5 in which the failed computing node has been replaced and a first erasure-coded data portion from a surviving computing node has been copied to a data shuttle device according to some embodiments.

In some embodiments, the method 400 can be implemented in a distributed storage environment 100 that has been configured using the method 300 described above. For example, as depicted in FIG. 5, a computing node 102 may fail or otherwise lose an erasure-coded data portion 114. In some embodiments, the computing node 102 may be replaced with a computing node 102d having a storage medium 106d that lacks the erasure-coded data portion 114, as depicted in FIG. 6. A storage management module 104d can determine that the erasure-coded data portion 114 is lost and notify one or more other storage management modules 104a, 104b (or another storage management application) that the erasure-coded data portion 114 must be restored. In other embodiments, the failed node 102c can be repaired, and the repaired node 102c can determine that the erasure-coded data portion 114 must be restored.

In either embodiment, this determination or notification that the erasure-coded data portion 114 is lost can cause the method 300 to be executed so that the computing nodes 102a, 102b and the data shuttle device 110 are configured for restoring the lost erasure-coded data portion 114.

The method 400 involves coupling a data shuttle device to a first node of a distributed storage environment that stores a first erasure-coded data portion, as shown in block 402. For example, a data shuttle device 110 can be communicatively coupled to the computing node 102a via one or more of a physical connection (e.g., a USB interface), a network connection (e.g., via a local area network ("LAN"), or a wireless connection (e.g., a Wi-Fi link).

In some embodiments, communicatively coupling the computing node 102a to the data shuttle device 110 can involve the computing node 102a obtaining a device identifier for the data shuttle device 110. A processing device of the computing node 102a can compare the obtained device identifier to a data shuttle device identifier provided by a storage management application as part of a restoration process. The computing node 102a can determine, based on the comparison, that the data shuttle device 110 is to be used in the restoration process and that the computing node 102a should perform one or more operations of the restoration process using the data shuttle device 110.

The method 400 also involves copying the first erasure-coded data portion from the first node to the data shuttle device, as shown in block 404. For example, as depicted in FIG. 6, the computing node 102a can copy the erasure-coded portion 108 and store the copy (i.e., the erasure-coded portion 108') on the data shuttle device 110.

In some embodiments, the computing node 102a can perform the copying operation in response to matching a device identifier for the data shuttle device 110 to a device identifier provided by a storage management application as part of a restoration process. For example, one or more instructions received from the storage management application for implementing the restoration process can include the device identifier for the data shuttle device 110 and one or more identifiers for one or more erasure-coded data portions used to restore a lost erasure-coded data portion. In response to detecting that the data shuttle device 110 is coupled to the computing node 102a (e.g., based on the identifier for the data shuttle device 110), the computing node 102a can identify and retrieve one or more erasure coded data portions from the storage medium 106a that match the erasure-coded data portions identified in the instructions. The computing node 102a can copy the retrieved erasure-coded data to the data shuttle device 110.

Figure 7:
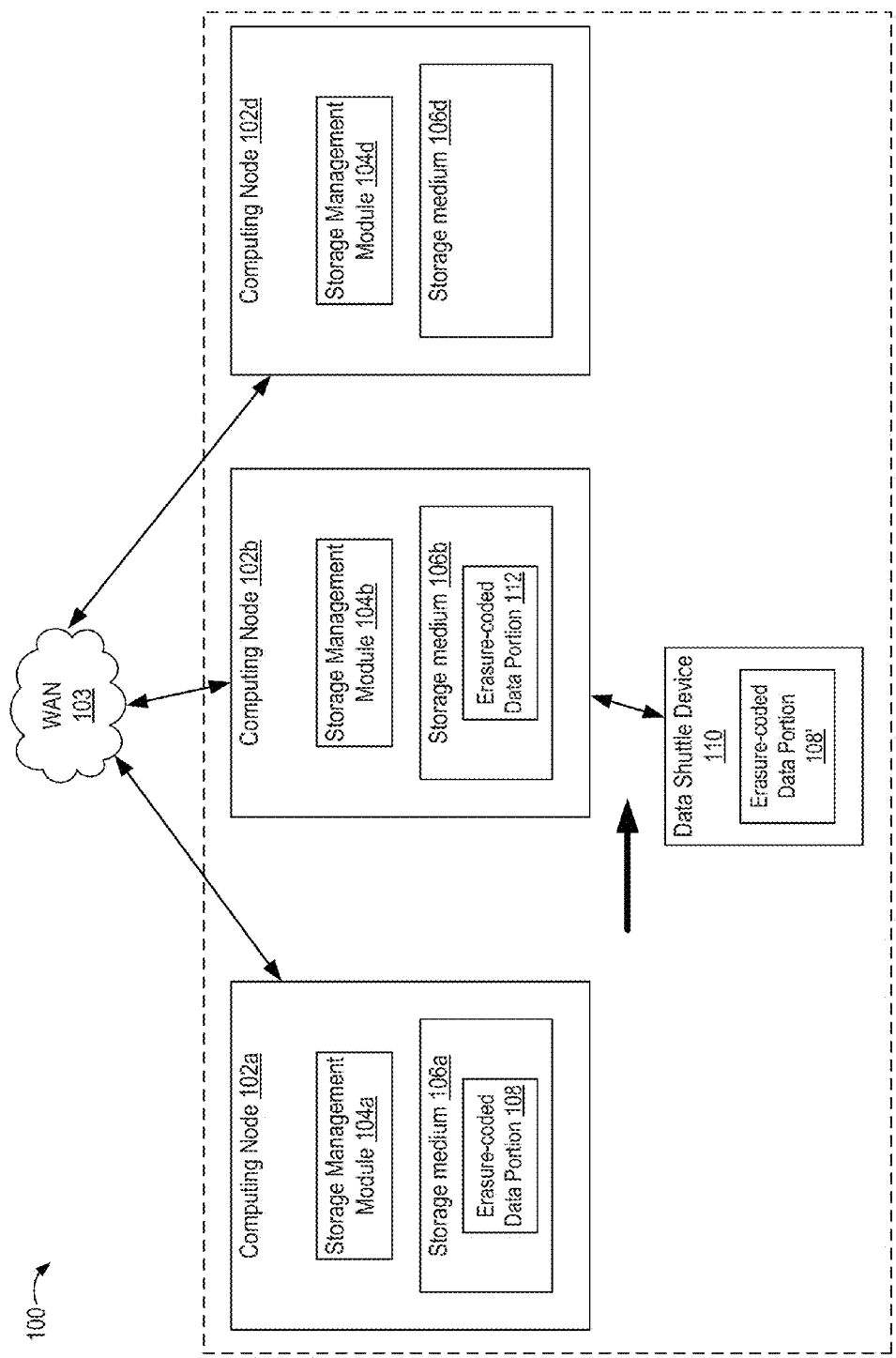
FIG. 7 is a block diagram depicting an example of the distributed storage environment of FIGS. 1, 5, and 6 in which the data shuttle device is physically transported to another surviving computing node according to some embodiments.

Returning to FIG. 4, the method 400 also involves coupling the data shuttle device to a second node of the distributed storage environment storing a second erasure-coded data portion, as shown in block 406. For example, as depicted in FIG. 7, the data shuttle device 110 can be physically transported to a computing node 102b. The data shuttle device 110 can be communicatively coupled to the computing node 102b via one or more of a physical connection (e.g., a USB interface), a network connection (e.g., via a LAN), or a wireless connection (e.g., a Wi-Fi link).

Figure 8:
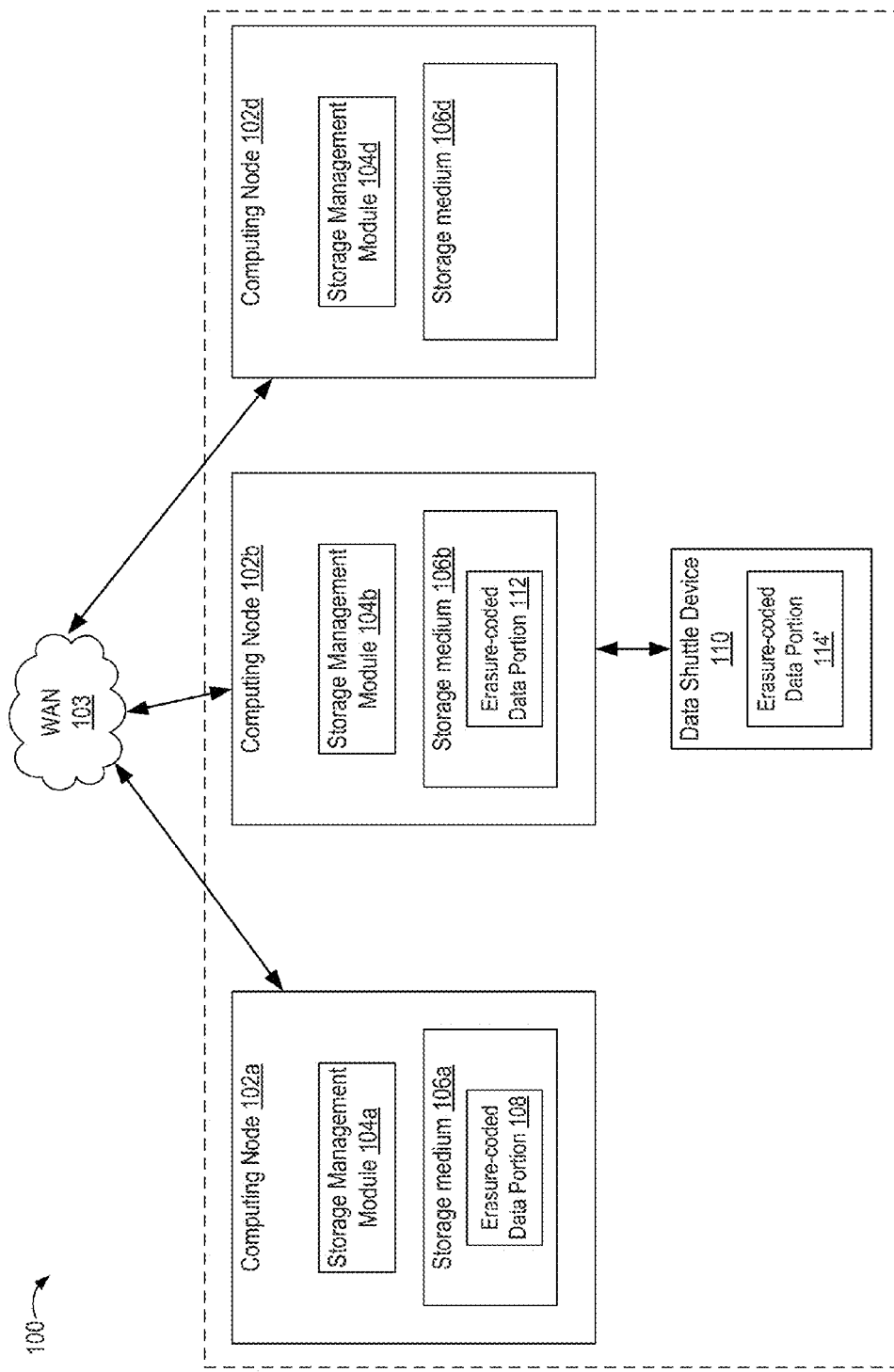
FIG. 8 is a block diagram depicting an example of the distributed storage environment of FIGS. 1 and 5-7 in which the first erasure-coded data portion on the data shuttle device and a second erasure-coded data portion stored on a surviving computing node are used to generate a third erasure-coded portion that was stored on the failed computing node according to some embodiments.

Returning to FIG. 4, the method 400 also involves generating a third erasure-coded data portion on the data shuttle device from the first erasure-coded data portion stored on the data shuttle device and the second erasure-coded data portion stored on the second node, as shown in block 408. For example, the computing node 102b can use the erasure-coded data portion 108' stored on the data shuttle device 110 and the erasure-coded data portion 112 stored on the storage medium 110b to generate a copy of the lost erasure-coded data portion 114. As depicted in FIG. 8, the copy of the lost erasure-coded data portion 114 (depicted as the erasure-coded data portion 114') can be stored on the data shuttle device 110.

In some embodiments, the data shuttle device 110 can be used to provide access to the erasure-coded data portion 114' while the data shuttle device 110 is coupled to the computing node 102b. For example, after the erasure-coded data portion 114' is generated on the data shuttle device 110, the storage management module 104b, suitable code stored on the data shuttle device 110, or both can cause the data shuttle device 110 to be set to "read" state. Setting the data shuttle device 110 to the "read" state can allow the erasure-coded data portion 114' stored on the data shuttle device 110 to be accessed via the WAN 103 by clients (e.g., other computing nodes in the storage environment 100, computing devices in communication with the storage environment 100, etc.).

The erasure-coded data portion 114' can be generated in any suitable manner. For example, a processing device of the computing node 102b can copy the erasure-coded data portion 108' to the storage medium 106b or another memory device accessible to the computing node 102b. The processing device can execute one or more suitable erasure-coding recovery algorithms to generate the erasure coded data portion 114' from the copied erasure-coded data portion 108' and the erasure-coded data portion 112 stored in the storage medium 106b. The processing device can write the generated erasure coded data portion 114' to the data shuttle device 110 and delete the copied erasure-coded data portion 108' from the memory device of the computing node 102b. In some embodiments, the generated erasure coded data portion 114' can overwrite the erasure-coded data portion 108' on the data shuttle device 110. Doing so can reduce the storage requirements for the data shuttle device 110.

Figure 9:
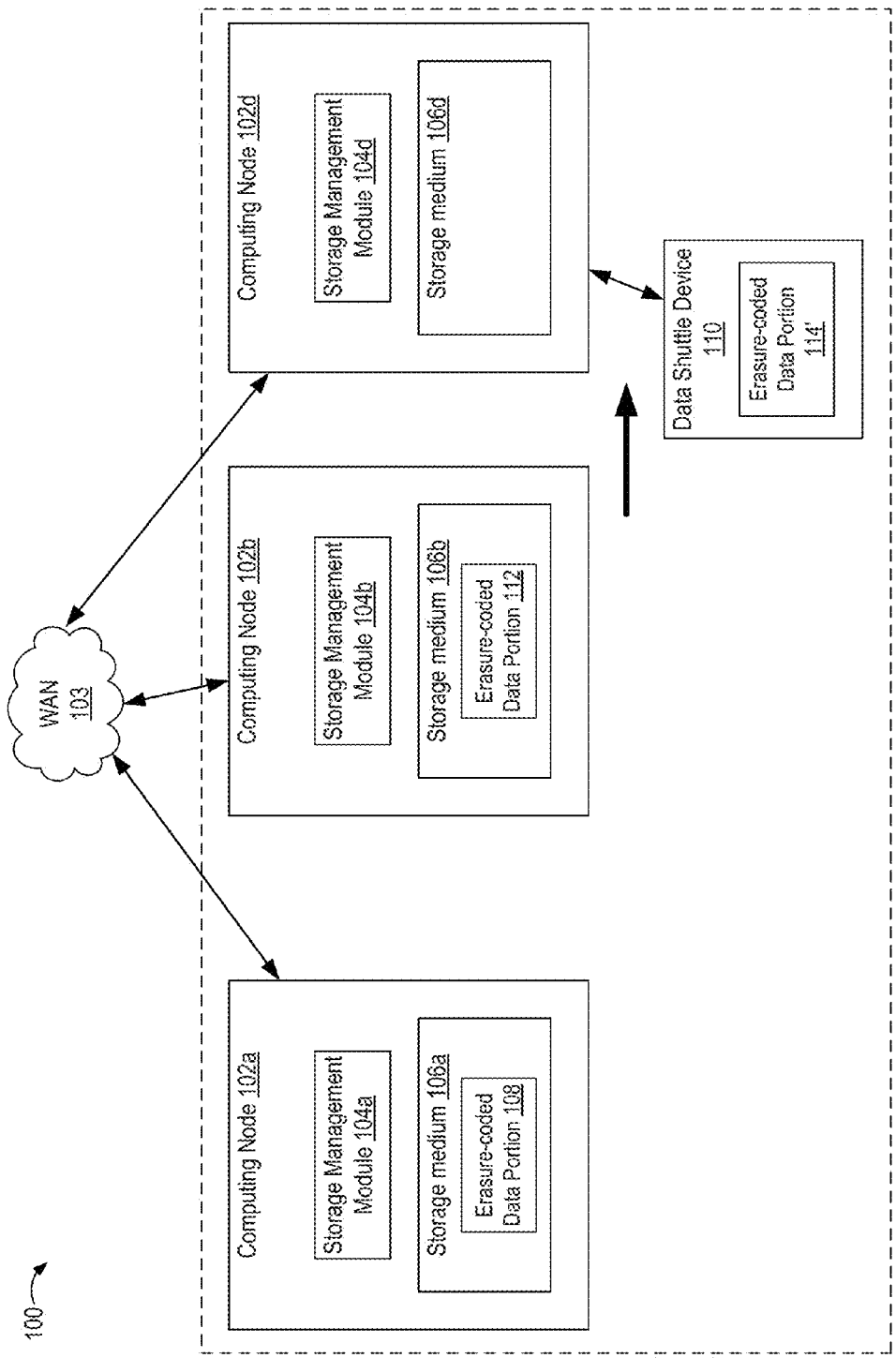
FIG. 9 is a block diagram depicting an example of the distributed storage environment of FIGS. 1 and 5-8 in which the data shuttle device is physically transported to the third computing node according to some embodiments.

Returning to FIG. 4, the method 400 also involves coupling the data shuttle device to a third node of the distributed storage environment at which the third erasure-coded data portion is to be restored, as shown in block 410. For example, the data shuttle device 110 can be physically transported to a computing node 102d that replaces a failed node 102c, as depicted in FIG. 9, or can be physically transported to a repaired computing node 102c from which the erasure-coded data portion 114 has been lost. The data shuttle device 110 can be communicatively coupled to the computing node 102d (or a repaired computing node 102c) via one or more of a physical connection (e.g., a USB interface), a network connection (e.g., via a LAN), or a wireless connection (e.g., a Wi-Fi link).

Figure 10:
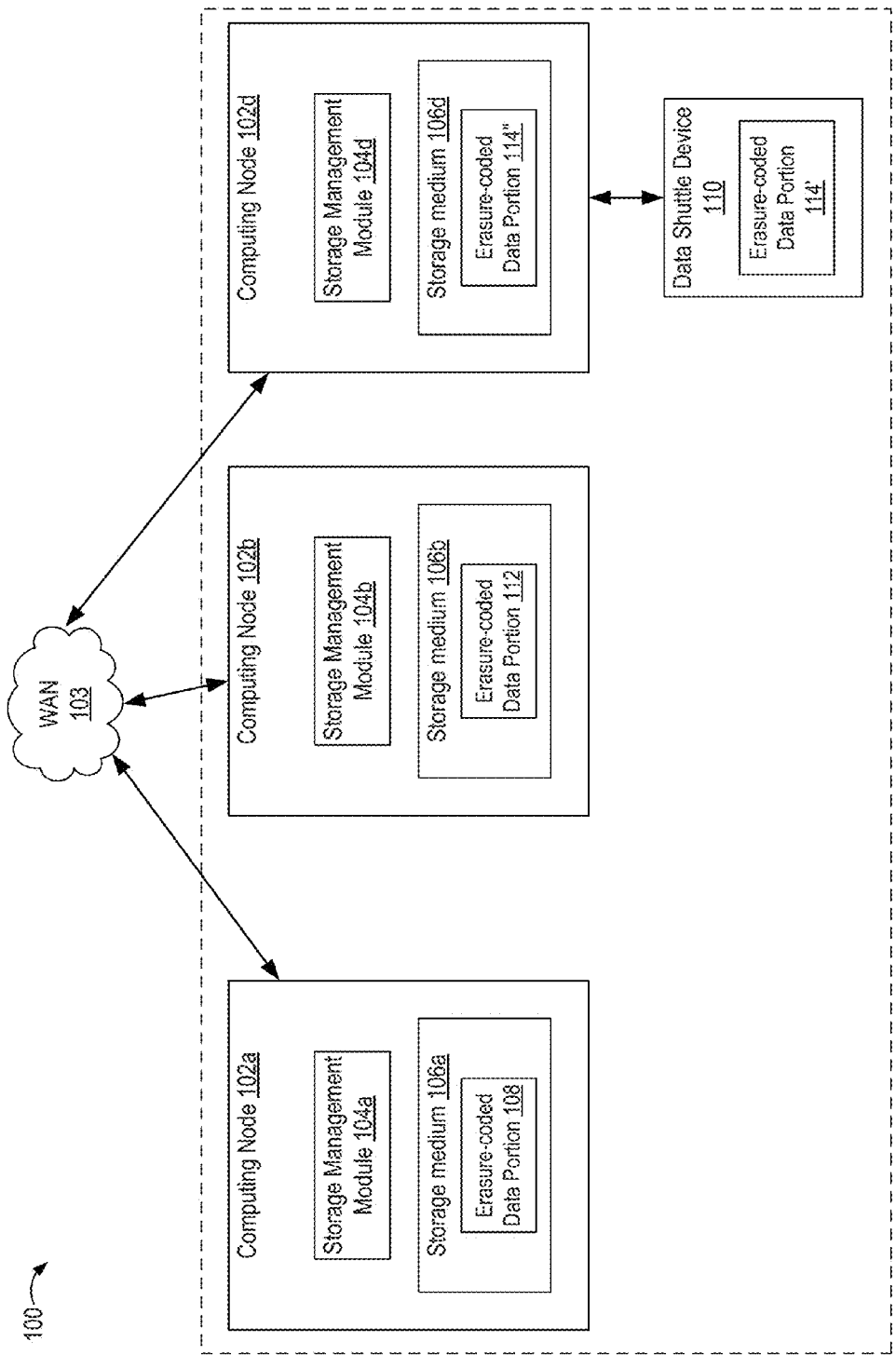
FIG. 10 is a block diagram depicting an example of the distributed storage environment of FIGS. 1 and 5-9 in which the data shuttle device is used to restore the third erasure-coded portion at the replacement computing node according to some embodiments.

Returning to FIG. 4, the method 400 also involves restoring the third erasure-coded data portion at the third node, as shown in block 412. For example, as depicted in FIG. 10, an erasure-coded portion 114' stored on the data shuttle device 110 can be copied to the storage medium 106d or otherwise transferred to the computing node 102d. The restored erasure-coded portion 114" resides in the storage medium 106d. In other embodiments, the erasure-coded portion 114' can be copied or otherwise transferred to a suitable storage medium of a repaired node 102c.

In some embodiments, the data shuttle device 110 can be used to provide access to the erasure-coded data portion 114' while the data shuttle device 110 is coupled to the computing node 102d. For example, while the data shuttle device 110 is coupled to the computing node 102d (e.g., before, during, or after the erasure-coded portion 114' is copied to the storage medium 106d), the storage management module 104d, suitable code stored on the data shuttle device 110, or both can cause the data shuttle device 110 to be set to "read" state. Setting the data shuttle device 110 to the "read" state can allow the erasure-coded data portion 114' stored on the data shuttle device 110 to be accessed via the WAN 103 by clients (e.g., other computing nodes in the storage environment 100, computing devices in communication with the storage environment 100, etc.).

For illustrative purposes, the methods described above involve one data shuttle device and three computing nodes. However, any suitable number of data shuttle devices and computing nodes can be used.

In some embodiments, a data shuttle device 110 can be separate from the computing node to be restored, as depicted in the example of FIGS. 5-10. But other implementations are possible. For example, in other embodiments, the data shuttle device 110 can be included in hardware used to restore a lost computing node. For example, the data shuttle device 110 may be included in a server used for the computing node 102d. The server can be transported to different sites in the distributed storage environment 100 to generate a lost erasure-coded data portion 114. The erasure-coded data portion 114 can be regenerated using the server with the data shuttle device 110 at the sites of the respect computing nodes 102a, 102b. The server can then be installed at the site of the lost computing node 102c.

Figure 11:
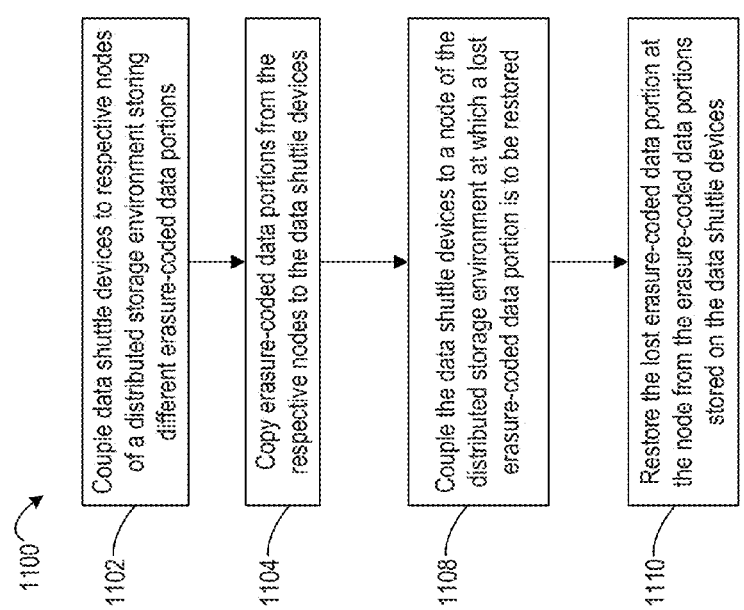
FIG. 11 is a flow chart depicting an example of another method for using a data shuttle device to restore erasure-coded data in a distributed storage environment according to some embodiments.

In additional or alternative embodiments, multiple data shuttles can be used to obtain copies of respective erasure-coded data portions from multiple computing nodes, and the data shuttles can be transported in parallel to a recovery site at which the lost data portion will be regenerated. FIG. 11 is a flow chart depicting an example of another method for using a data shuttle device to restore erasure-coded data in a distributed storage environment according to some embodiments. For illustrative purposes, the method 1100 depicted in FIG. 11 is described with reference to the devices depicted in FIG. 2. Other implementations, however, are possible.

The method 1100 involves coupling data shuttle devices to respective nodes of a distributed storage environment storing different erasure-coded data portions, as shown in block 1102. For example, in the example above in which a computing node 102c has failed, a first data shuttle device can be communicatively coupled to the computing node 102a and a second data shuttle device can be communicatively coupled to the computing node 102b.

The method 1100 also involves copying the erasure-coded data portions from the respective computing nodes to the respective data shuttle devices, as shown in block 1104. For example, the computing node 102a can copy the erasure-coded data portion 108 to the first data shuttle, and the computing node 102b can copy the erasure-coded data portion 112 to the second data shuttle.

The method 1100 also involves coupling the data shuttle devices to a node of the distributed storage environment at which a lost erasure-coded data portion is to be restored, as shown in block 1106. For example, the first data shuttle device having the erasure-coded data portion 108 can be physically transported from the computing node 102a to the computing node 102c (or a computing node 102d that has replaced a failed computing node 102c). The second data shuttle device having the erasure-coded data portion 112 can be physically transported from the computing node 102a to the computing node 102c (or a computing node 102d that has replaced a failed computing node 102c). The computing node 102c (or a computing node 102d that has replaced a failed computing node 102c) can be communicatively coupled to the first and second data shuttle devices.

The method 1100 also involves restoring the lost erasure-coded data portion at the node from the erasure-coded data portions stored on the data shuttle devices, as shown in block 1108. For example, a lost erasure-coded data portion 114 can be regenerated by a repaired computing node 102c or a replacement computing node 102c by applying one or more erasure-coding recovery algorithms to the erasure-coded data portions 108, 112 that are respectively stored on the first and second data shuttle devices.

In additional or alternative embodiments, one or more of the methods 300, 400, and 1100 can be used in combination. For example, a computing node 102c may lose multiple erasure-coded data portions 114, some of which can be restored from certain erasure-coded data portions 108, 112 stored at computing nodes 102a, 102b, and others of which can be restored from other erasure-coded data portions 108, 112 stored at computing nodes 102a, 102b. The size of the erasure-coded data portions 114 may be so large that it may be undesirable (e.g., due to time constraints) to copy all of the erasure-coded data portions 108 to one or more data shuttle devices 110 and then regenerate all of the lost erasure-coded data portions 114 at computing node 102b. To restore the multiple erasure-coded data portions 114 in a more efficient manner, sets of data shuttle devices can be transported in parallel to different surviving nodes and used to restore different portions of the lost erasure-coded data in parallel.

For example, a first set of data shuttle devices 110 can be coupled to the computing node 102a. A first subset of the erasure-coded data portions 108 can be copied from the storage medium 106a to the first set of data shuttle devices 110. The first set of data shuttle devices 110 can then be transported to the location of the computing node 102b and coupled to the computing node 102b. At the location of the computing node 102b, a first subset of the lost erasure-coded data portions 114' can be generated from (a) the first subset of the erasure-coded data portions 108 that are copied to the first set of data shuttle devices 110 and (b) a first subset of the erasure-coded data portions 112 stored on the storage medium 106b.

Continuing with this example, a second set of data shuttle devices 110 can be coupled to the computing node 102b. A second subset of the erasure-coded data portions 112 can be copied from the storage medium 106b to the second set of data shuttle devices 110. The second set of data shuttle devices 110 can then be transported to the location of the computing node 102a and coupled to the computing node 102a. At the location of the computing node 102a, a second subset of the lost erasure-coded data portions 114' can be generated from (a) the second subset of the erasure-coded data portions 112 copied to the second set of data shuttle devices 110 and (b) a second subset of the erasure-coded data portions 108 stored on the storage medium 106a. These operations can be performed, at least in part, in parallel with the regeneration of the first subset of the lost erasure-coded data portions 114.

Continuing with this example, the first and second sets of data shuttle devices 110 can be transported to the location of the computing node 102c (or a computing node 102d that has replaced the computing node 102c). The first and second subsets of the lost erasure-coded data portions 114' can be copied to the computing node 102c (or a computing node 102d that has replaced the computing node 102c) from the first and second sets of data shuttle devices 110, or can otherwise be restored using the first and second sets of data shuttle devices 110.

Any suitable computing devices can be used to perform the operations described herein. For example, FIG. 12 is a block diagram depicting examples of devices of a distributed storage environment in which one or more data shuttle devices can be used for restoring erasure-coded data according to some embodiments.

Figure 12:
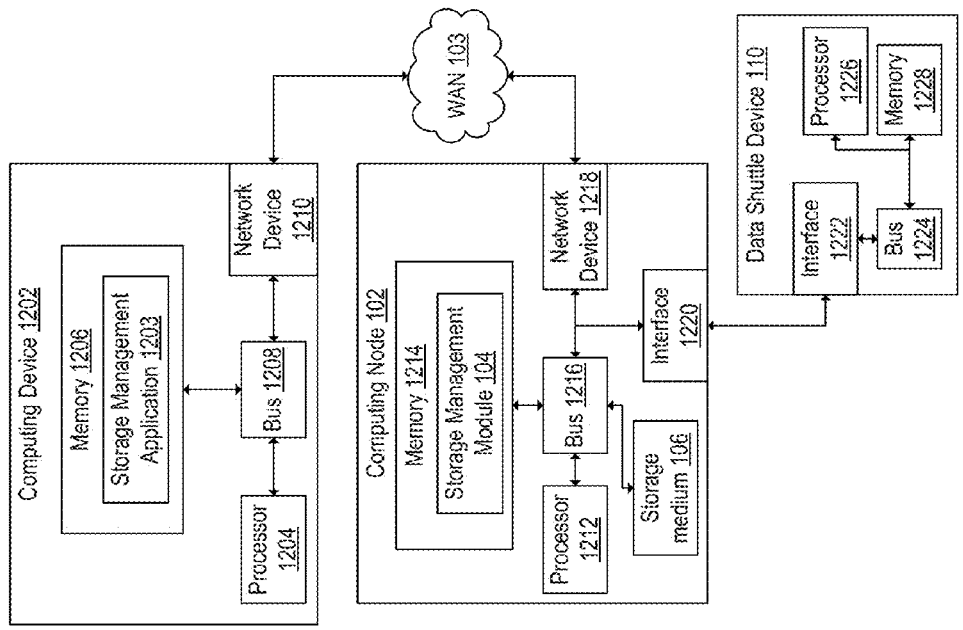
FIG. 12 is a block diagram depicting examples of devices of a distributed storage environment in which one or more data shuttle devices can be used for restoring erasure-coded data according to some embodiments.

In some embodiments, a computing device 1202 can execute a storage management application 1203 and a computing node 102 (e.g., one or more of the computing nodes 102a-c depicted in FIG. 2) can execute a storage management module 104, as depicted in FIG. 12. The computing device 1202 can include any suitable device for managing resources in the distributed storage environment 100. In other embodiments, the computing device 1202 can be omitted, and the storage management application 1203 can include storage management modules executed on the computing nodes 102a-c.

The computing device 1202 and the computing node 102 can respectively include processors 1204, 1212 that are communicatively coupled to respective memory devices 1206, 1214. The processors 1204, 1212 can execute computer-executable program code stored in the memory devices 1206, 1214. The processor 1204 can execute a storage management application 1203 or other computer-executable program code stored in the memory device 1206. The processor 1212 can execute a storage management module 104 or other computer-executable program code stored in the memory device 1214. When executed by the processors 1204, 1212, the program code stored in the memory devices 1206, 1214 can cause the processors 1204, 1212 to perform one or more operations described herein.

The computing node 102 can also include a storage medium 106. In some embodiments, the memory device 1214 and the storage medium 106 can be separate devices, as depicted in FIG. 11. In other embodiments, the memory device 1214 and the storage medium 106 can be included in the same device.

The computing device 1202 and the computing node 102 can also respectively include buses 1208, 1216. Each of the buses 1208, 1216 can communicatively couple one or more components of a respective one of the computing device 1202 and the computing node 102.

The computing device 1202 can also include one or more network devices 1210 and the computing node 102 can include one or more network devices 1218. The network devices 1210, 1218 can include any device or group of devices suitable for establishing a wireless data connection. Non-limiting examples of the network devices 1210, 1218 include one or more of an Ethernet network adapter, an RF transceiver, a modem, an optical emitter, an optical transceiver, etc.

FIG. 12 also depicts an example of a data shuttle device 110. The data shuttle device 110 can be communicatively coupled to a computing node 102 via an interface 1222 of the data shuttle device 110 and an interface 1220 of the computing node 102. In some embodiments, one or more of the interfaces 1220, 1222 can include devices for physically connecting the data shuttle device 110 and the computing node 102. For example, the interfaces 1220, 1222 can be USB interfaces. In additional or alternative embodiments, one or more of the interfaces 1220, 1222 can include devices for coupling the data shuttle device 110 and the computing node 102 via a short-range wireless link. For example, the interfaces 1220, 1222 can be Wi-Fi transceivers or other suitable short-range wireless interfaces.

In additional or alternative embodiments, one or more of the interfaces 1220, 1222 can include devices for coupling the data shuttle device 110 and the computing node 102 via a data network. For example, the interfaces 1220, 1222 can be Ethernet transceivers or other network devices. Although FIG. 12 depicts a computing node 102 having an interface 1220 that is separate from a network device 1218, the network device 1218 can, in some embodiments, be used to communicatively couple the computing node to the WAN 103 and to the data shuttle device 110 via a LAN.

The data shuttle device 110 can include a processor 1226 and a memory 1228 that are communicatively coupled to the interface 1222 via a bus 1224. The processor 1226 can execute suitable program code stored in the memory 1228 that configures the processor 1226 to perform one or more operations described herein. The memory 1228 can include one or more non-transitory computer-readable media. For example, the memory 1228 can include one or more media storing program code suitable for performing operations described herein, and can also include one or more media for storing one or more erasure-coded data portions.

Any suitable hardware can be used to implement the various devices depicted in FIG. 12. Each of the processors 1204, 1212, 1226 includes suitable processing hardware such as (but not limited to) a microprocessor, an application-specific integrated circuit ("ASIC"), etc. Each of the processors 1204, 1212, 1226 can include any number of processing devices, including one. Each of the buses 1208, 1216, 1224 can include one or more devices for coupling various components, such as (but not limited to) a memory bus, a system interconnect device, etc. Each of the memory devices 1206, 1214, 1228 can include any suitable computer-readable medium.

A computer-readable medium can include any electronic, optical, magnetic, or other storage device capable of providing a processor with computer-readable instructions or other program code. Non-limiting examples of a computer-readable medium include a magnetic disk, a memory chip, ROM, RAM, an ASIC, a configured processor, optical storage, magnetic tape or other magnetic storage, or any other medium from which a computer processor can read program code. The program code may include processor-specific instructions generated by a compiler or interpreter from code written in any suitable computer-programming language, including, for example, C, C++, C#, etc.

GENERAL CONSIDERATIONS

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

Some embodiments described herein may be conveniently implemented using a conventional general purpose or a specialized digital computer or microprocessor programmed according to the teachings herein, as will be apparent to those skilled in the computer art. Some embodiments may be implemented by a general purpose computer programmed to perform method or process steps described herein. Such programming may produce a new machine or special purpose computer for performing particular method or process steps and functions (described herein) pursuant to instructions from program software. Appropriate software coding may be prepared by programmers based on the teachings herein, as will be apparent to those skilled in the software art. Some embodiments may also be implemented by the preparation of application-specific integrated circuits or by interconnecting an appropriate network of conventional component circuits, as will be readily apparent to those skilled in the art. Those of skill in the art will understand that information may be represented using any of a variety of different technologies and techniques.

Some embodiments include a computer program product comprising a computer readable medium (media) having instructions stored thereon/in that, when executed (e.g., by a processor), cause the executing device to perform the methods, techniques, or embodiments described herein, the computer readable medium comprising instructions for performing various steps of the methods, techniques, or embodiments described herein. The computer readable medium may comprise a non-transitory computer readable medium. The computer readable medium may comprise a storage medium having instructions stored thereon/in which may be used to control, or cause, a computer to perform any of the processes of an embodiment. The storage medium may include, without limitation, any type of disk including floppy disks, mini disks (MDs), optical disks, DVDs, CD-ROMs, micro-drives, and magneto-optical disks, ROMs, RAMs, EPROMs, EEPROMs, DRAMs, VRAMs, flash memory devices (including flash cards), magnetic or optical cards, nanosystems (including molecular memory ICs), RAID devices, remote data storage/archive/warehousing, or any other type of media or device suitable for storing instructions and/or data thereon/in.

Stored on any one of the computer readable medium (media), some embodiments include software instructions for controlling both the hardware of the general purpose or specialized computer or microprocessor, and for enabling the computer or microprocessor to interact with a human user and/or other mechanism using the results of an embodiment. Such software may include without limitation device drivers, operating systems, and user applications. Ultimately, such computer readable media further includes software instructions for performing embodiments described herein. Included in the programming (software) of the general-purpose/specialized computer or microprocessor are software modules for implementing some embodiments.

The various illustrative logical blocks, modules, and circuits described in connection with the embodiments disclosed herein may be implemented or performed with a general-purpose processing device, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processing device may be a microprocessor, but in the alternative, the processor may be any conventional processor, controller, microcontroller, or state machine. A processing device may also be implemented as a combination of computing devices, e.g., a combination of a DSP and a microprocessor, a plurality of microprocessors, one or more microprocessors in conjunction with a DSP core, or any other such configuration Aspects of the methods disclosed herein may be performed in the operation of such processing devices. The order of the blocks presented in the figures described above can be varied—for example, some of the blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation and are not meant to be limiting.

While the present subject matter has been described in detail with respect to specific examples thereof, it will be appreciated that those skilled in the art, upon attaining an understanding of the foregoing may readily produce alterations to, variations of, and equivalents to such aspects and examples. Accordingly, it should be understood that the present disclosure has been presented for purposes of example rather than limitation, and does not preclude inclusion of such modifications, variations, and/or additions to the present subject matter as would be readily apparent to one of ordinary skill in the art.

The invention claimed is:

1. A method comprising:
    detecting that a first data shuttle device is communicatively coupled to a first node of a distributed storage environment comprising the first node and a second node;
    generating, from a first erasure-coded data portion stored on the first node, first restoration data on the first data shuttle device responsive to detecting that the first data shuttle device is communicatively coupled to the first node;
    detecting that the first data shuttle device or a second data shuttle device is communicatively coupled to the second node;
    generating, from a second erasure-coded data portion stored on the second node, second restoration data on the first or second data shuttle device communicatively coupled to the second node, wherein the second restoration data is generated responsive to detecting that the first or second data shuttle device is communicatively coupled to the second node; and
    restoring a third erasure-coded data portion at a third node of the distributed storage environment subsequent to physically transporting at least one of the first or second data shuttle devices from at least one of the first or second nodes to a location of the third node, wherein the third erasure-coded data portion is generated via an erasure-coding process from at least one of the first restoration data stored on the first or second data shuttle device or the second restoration data stored on the first or second data shuttle device.

2. The method of claim 1, wherein generating and storing the first restoration data comprises copying the first erasure-coded data portion to the first data shuttle device;
    wherein the first data shuttle device is detected as being communicatively coupled to the second node subsequent to the first restoration data being generated and the first data shuttle device being decoupled from the first node;

wherein the second restoration data comprises the third erasure-coded data portion and is generated on the first data shuttle device from the first erasure-coded data portion stored on the first data shuttle device and the second erasure-coded data portion stored on the second node;

wherein restoring the third erasure-coded data portion at the third node comprises copying the third erasure-coded data portion from the first data shuttle device to the third node or installing the first data shuttle device as the third node after physically transporting the first data shuttle device from the second node to the location of the third node.

3. The method of claim 2, wherein generating and storing the second restoration data comprises:

copying the first erasure-coded data portion from the first data shuttle device to a memory of the second node;

generating the third erasure-coded data portion in the memory of the second node from the first erasure-coded data portion copied from the first data shuttle device and the second erasure-coded data portion stored at the second node; and replacing the first erasure-coded data portion stored on the first data shuttle device with the third erasure-coded data portion generated in the memory of the second node.

4. The method of claim 1, further comprising, prior to generating the first restoration data and the second restoration data:

determining that the third node has failed;

identifying the first node and the second node as respectively storing the first erasure-coded data portion and the second erasure-coded data portion;

determining that the third node is to be restored using the at least one of the first data shuttle device or the second data shuttle device; and configuring the identified first and second nodes and the at least one of the first data shuttle device or the second data shuttle device for restoring the third erasure-coded data portion using the first erasure-coded data portion and the second erasure-coded data portion.

5. The method of claim 4, wherein configuring the identified first and second nodes and the at least one of the first data shuttle device or the second data shuttle device for restoring the third erasure-coded data portion comprises:

identifying at least one device identifier for the at least one of the first data shuttle device or the second data shuttle device; and instructing the first node and the second node to respectively generate the first restoration data and the second restoration data in response to detecting a device having the at least one device identifier.

6. The method of claim 4, wherein determining that the third node is to be restored using the at least one of the first data shuttle device or the second data shuttle device comprises determining that an amount of data traffic generated by transmitting at least one of the first erasure-coded data portion or the second erasure-coded data portion via a data network to the third node exceeds a threshold amount of data traffic.

7. The method of claim 1, wherein at least one of the first or second data shuttle devices comprises or is included in a server and wherein restoring the third erasure-coded data portion at the third node comprises installing the server as the third node.

8. The method of claim 1, wherein at least one of the first or second data shuttle devices attaches to a server and wherein restoring the third erasure-coded data portion at the third node comprises installing an additional server and attaching the first or second data shuttle device to the additional server as the third node.

9. The method of claim 1, wherein the third node comprises a server and wherein restoring the third erasure-coded data portion at the third node comprises:

communicatively coupling at least one of the first or second data shuttle devices to the server at the location of the third node; and copying the third erasure-coded data portion from the at least one of the first or second data shuttle devices to the server via the communicative coupling.

10. The method of claim 1, wherein the method further comprises providing, to a client of the distributed storage environment, access to the third erasure-coded data portion from at least one of the first or second data shuttles, wherein the access is provided while the at least one of the first or second data shuttles is communicatively coupled to at least one of the first, second, or third nodes.

11. The method of claim 1, wherein the first data shuttle device is included in a first set of data shuttle devices and the second data shuttle device is included in a second set of data shuttle devices, wherein generating the first restoration data on the first data shuttle device comprises copying the first erasure-coded data portion to the first set of data shuttle devices and generating the second restoration data on the second data shuttle device comprises copying the second erasure-coded data portion to the second set of data shuttle devices, further comprising:

generating, on the first set of data shuttle devices subsequent to the first set of data shuttle devices being transported to the second node, the third erasure-coded data portion by applying the erasure-coding process to (i) the first erasure-coded data portion copied on the first set of data shuttle devices and (ii) a fourth erasure-coded data portion stored at the second node, wherein the third erasure-coded data portion at the third node is restored at the third node from the first set of data shuttle devices subsequent to physically transporting the first set of data shuttle devices to the location of the third node;

generating, on the second set of data shuttle devices subsequent to the second set of data shuttle devices being transported to the first node, a fifth erasure-coded data portion by applying the erasure-coding process to (i) the second erasure-coded data portion copied on the second set of data shuttle devices and (ii) a sixth erasure-coded data portion stored at the second node; and restoring the fifth erasure-coded data portion at the third node subsequent to physically transporting the second set of data shuttle devices to the location of the third node.

12. A non-transitory machine-readable medium having stored thereon instructions for performing a method comprising machine-executable code that, when executed by at least one machine, causes the at least one machine to:

detect that a first data shuttle device is communicatively coupled to a first node of a distributed storage environment comprising the first node and a second node;

generate, from a first erasure-coded data portion stored on the first node, first restoration data on the first data shuttle device responsive to detecting that the first data shuttle device is communicatively coupled to the first node;

detect that the first data shuttle device or a second data shuttle device is communicatively coupled to the second node;

generate, from a second erasure-coded data portion stored on the second node, second restoration data on the first or second data shuttle device communicatively coupled to the second node, wherein the second restoration data is generated responsive to detecting that the first or second data shuttle device is communicatively coupled to the second node; and restore a third erasure-coded data portion at a third node of the distributed storage environment subsequent to at least one of the first or second data shuttle devices being transported from at least one of the first or second nodes to a location of the third node, wherein the third erasure-coded data portion is generated via an erasure-coding process from at least one of the first restoration data stored on the first or second data shuttle device or the second restoration data stored on the first or second data shuttle device.

13. The non-transitory machine-readable medium of claim 12, wherein generating and storing the first restoration data comprises copying the first erasure-coded data portion to the first data shuttle device;

wherein the first data shuttle device is detected as being communicatively coupled to the second node subsequent to the first restoration data being generated and the first data shuttle device being decoupled from the first node;

wherein the second restoration data comprises the third erasure-coded data portion and is generated on the first data shuttle device from the first erasure-coded data portion stored on the first data shuttle device and the second erasure-coded data portion stored on the second node;

wherein restoring the third erasure-coded data portion at the third node comprises copying the third erasure-coded data portion from the first data shuttle device to the third node or installing the first data shuttle device as the third node after physically transporting the first data shuttle device from the second node to the location of the third node.

14. The non-transitory machine-readable medium of claim 13, wherein generating and storing the second restoration data comprises:

copying the first erasure-coded data portion from the first data shuttle device to a memory of the second node;

generating the third erasure-coded data portion in the memory of the second node from the first erasure-coded data portion copied from the first data shuttle device and the second erasure-coded data portion stored at the second node; and replacing the first erasure-coded data portion stored on the first data shuttle device with the third erasure-coded data portion generated in the memory of the second node.

15. The non-transitory machine-readable medium of claim 12, wherein the machine-executable code, when executed by the at least one machine, causes the at least one machine to perform, prior to generating the first restoration data and the second restoration data, operations comprising:

determining that the third node has failed;

identifying the first node and the second node as respectively storing the first erasure-coded data portion and the second erasure-coded data portion;

determining that the third node is to be restored using the at least one of the first data shuttle device or the second data shuttle device; and configuring the identified first and second nodes and the at least one of the first data shuttle device or the second data shuttle device for restoring the third erasure-coded data portion using the first erasure-coded data portion and the second erasure-coded data portion.

16. A computing system comprising:

a memory containing machine readable medium comprising machine-executable code having stored thereon instructions for performing a method;

at least one processor coupled to the memory, the processor configured to execute the machine-executable code to cause the at least one processor to:

detect that a first data shuttle device is communicatively coupled to a first node of a distributed storage environment comprising the first node and a second node, generate, from a first erasure-coded data portion stored on the first node, first restoration data on the first data shuttle device responsive to detecting that the first data shuttle device is communicatively coupled to the first node, detect that the first data shuttle device or a second data shuttle device is communicatively coupled to the second node, generate, from a second erasure-coded data portion stored on the second node, second restoration data on the first or second data shuttle device communicatively coupled to the second node, wherein the second restoration data is generated responsive to detecting that the first or second data shuttle device is communicatively coupled to the second node, and restore a third erasure-coded data portion at a third node of the distributed storage environment at a location of the third node, wherein the third erasure-coded data portion is restored via an erasure-coding process from at least one of the first restoration data stored on the first or second data shuttle device or the second restoration data stored on the first or second data shuttle device.

17. The computing system of claim 16, wherein the at least one processor is configured to generate and store the first restoration data by copying the first erasure-coded data portion to the first data shuttle device;

wherein the at least one processor is configured to detect the first data shuttle device as being communicatively coupled to the second node subsequent to the first restoration data being generated and the first data shuttle device being decoupled from the first node;

wherein the second restoration data comprises the third erasure-coded data portion and is generated on the first data shuttle device from the first erasure-coded data portion stored on the first data shuttle device and the second erasure-coded data portion stored on the second node;

wherein the at least one processor is configured to restore the third erasure-coded data portion at the third node by copying the third erasure-coded data portion from the first data shuttle device to the third node or installing the first data shuttle device as the third node after physically transporting the first data shuttle device from the second node to the location of the third node.

18. The computing system of claim 17, wherein the at least one processor is configured to generate and store the second restoration data by performing operations comprising:

copying the first erasure-coded data portion from the first data shuttle device to a memory of the second node;

generating the third erasure-coded data portion in the memory of the second node from the first erasure-coded data portion copied from the first data shuttle device and the second erasure-coded data portion stored at the second node; and replacing the first erasure-coded data portion stored on the first data shuttle device with the third erasure-coded data portion generated in the memory of the second node.

19. The computing system of claim 16, wherein the at least one processor is configured to perform, prior to generating the first restoration data and the second restoration data, operations comprising:

determining that the third node has failed;

identifying the first node and the second node as respectively storing the first erasure-coded data portion and the second erasure-coded data portion;

determining that the third node is to be restored using the at least one of the first data shuttle device or the second data shuttle device; and configuring the identified first and second nodes and the at least one of the first data shuttle device or the second data shuttle device for restoring the third erasure-coded data portion using the first erasure-coded data portion and the second erasure-coded data portion.

20. The computing system of claim 16, wherein the first data shuttle device is included in a first set of data shuttle devices and the second data shuttle device is included in a second set of data shuttle devices, wherein the at least one processor is configured to generate the first restoration data on the first data shuttle device by copying the first erasure-coded data portion to the first set of data shuttle devices and generating the second restoration data on the second data shuttle device comprises copying the second erasure-coded data portion to the second set of data shuttle devices, wherein the at least one processor is further configured to:

generate, on the first set of data shuttle devices subsequent to the first set of data shuttle devices being transported to the second node, the third erasure-coded data portion by applying the erasure-coding process to (i) the first erasure-coded data portion copied on the first set of data shuttle devices and (ii) a fourth erasure-coded data portion stored at the second node, wherein the third erasure-coded data portion at the third node is restored at the third node from the first set of data shuttle devices subsequent to the first set of data shuttle devices being physically transported to the location of the third node;

generate, on the second set of data shuttle devices subsequent to the second set of data shuttle devices being transported to the first node, a fifth erasure-coded data portion by applying the erasure-coding process to (i) the second erasure-coded data portion copied on the second set of data shuttle devices and (ii) a sixth erasure-coded data portion stored at the second node; and restore the fifth erasure-coded data portion at the third node subsequent to the second set of data shuttle devices being physically transported to the location of the third node.

* * * * *